United States Patent [19]
Yagi et al.

[11] Patent Number: 5,586,900
[45] Date of Patent: Dec. 24, 1996

[54] CONNECTOR TERMINAL TEST JIG

[75] Inventors: Sakai Yagi; Masanori Tsuji; Motohisa Kashiyama; Takayoshi Endo, all of Shizuoka-ken, Japan

[73] Assignee: Yazaki Corporation, Tokyo, Japan

[21] Appl. No.: 432,426

[22] Filed: Apr. 27, 1995

[30] Foreign Application Priority Data

May 9, 1994 [JP] Japan .................................. 6-095083

[51] Int. Cl.⁶ .................................................. H01R 13/62
[52] U.S. Cl. ........................................... 439/310; 324/538
[58] Field of Search .................................. 439/310, 482, 439/488, 259, 261, 296; 324/537, 538, 754; 29/593

[56] References Cited

U.S. PATENT DOCUMENTS

| | | | |
|---|---|---|---|
| 4,658,212 | 4/1987 | Ozawa et al. | 439/310 |
| 4,902,968 | 2/1990 | Sugimoto | 324/537 |
| 5,419,711 | 5/1995 | Noro et al. | 439/310 |
| 5,429,519 | 7/1995 | Murakami et al. | 439/310 |
| 5,458,500 | 10/1995 | Aikawa | 439/310 |
| 5,467,023 | 11/1995 | Takeyama | 439/310 |

FOREIGN PATENT DOCUMENTS 2-5383   1/1990   Japan .

Primary Examiner—Neil Abrams
Assistant Examiner—Yong Kim
Attorney, Agent, or Firm—Finnegan, Henderson, Farabow, Garrett & Dunner, L.L.P.

[57] ABSTRACT

To inspect the conduction of terminals of a connector having a rear terminal holder (65) without damaging the rear terminal holder, the connector (49) to be tested is first fitted to a connector support member (39) of the terminal conduction test jig (33); and then a test body (41) of the terminal conduction test jig is moved toward the connector support member (39) to first engage the rear terminal holder (65) with the connector housing (55) normally and then inspect conduction of the terminals (35) of the connector (49). That is, a fitted contact projection (85) of the test body (41) is inserted into the connector housing (55) to engage the rear terminal holder with the connector housing normally; and after that the test body (41) is further moved toward the connector support member (39) to bring terminal conduction test pins (89) into contact with the terminals (35) for terminal conduction test.

7 Claims, 7 Drawing Sheets

FRONT ↔ REAR

CONNECTOR TERMINAL TEST JIG

BACKGROUND OF THE INVENTION

1. Technical Field

The present invention relates to a connector terminal conduction test jig for testing conduction of terminals arranged in a connector housing, and more specifically to a connector terminal conduction test jig suitable for use in a connector having a hood portion in which a plurality of connector terminals are arranged.

2. Description of the Related Art

An example of the connector terminal conduction test jig is disclosed in Japanese Published Unexamined Patent Application No. 2-5383, which can inspect conduction of connector terminals and mounted condition of a connector member (e.g., a holding spacer) attached onto a side surface of a connector housing. In the conventional connector terminal conduction test jig, only when the holding spacer is correctly attached to the side surface of the connector housing, since an operation lever can be pivoted to move the test pins into contact with the terminals of the connector, the terminal conduction test can be effected. In other words, when the holding spacer is not correctly attached to the side surface of a connector housing, the terminal conduction test cannot be effected.

In the convectional connector terminal conduction test jig, however, when the holding spacer or another connector member (e.g., terminal holder member) is attached onto the rear end side of the connector housing, the connector cannot be tested. Further, under the condition that the connector member is not correctly attached to the side surface of the connector housing, if the conduction test pins are inserted into the connector housing forcedly, there exists a problem in that the holding spacer is easily damaged.

SUMMARY OF THE INVENTION

With these problems in mind therefore, it is the object of the present invention to provide a connector terminal conduction test jig, which can inspect the conduction of terminals of a connector housing having a connector member (e.g., rear terminal holder) at the rear end thereof, without damaging the connector, even if the rear terminal holder is not correctly attached thereto.

To achieve the above-mentioned object, the present invention provides a connector terminal conduction test jig for testing conduction of terminals (35) of a connector (49) having a engaging member (65) engaged with a connector housing (55) thereof, which includes: a connector support member (39) for supporting the connector (49) to be tested; a test body member (69) disposed movably toward and away from said connector support member and formed with a plurality of through holes (77) each for supporting a terminal conduction test pin (89) movably therein; a contact plate member (73) attached to said test body member and composed of a contact surface (83) and a fitted contact projection (85) formed with a plurality of test pin accommodating holes (87) each communicating with each through hole (77) of said test body member; and when said test body member (69) is moved toward said connector support member (39), the fitted contact projection (85) being first inserted into the connector housing (55) so that the contact surface (83) of said contact plate member (73) urges the connector housing (55) toward said connector support member (39) to correctly engage the engaging member (65) with the connector housing (55), and after that terminal ends (35a) of the terminals (35) arranged in the connector housing being inserted into the test pin accommodating holes (87) of the fitted contact projection (85) into contact with the terminal conduction test pins (89) in the test body member (69) for terminal conduction test.

Further, the engaging member (65) engaged with the connector housing is a rear terminal holder attached to a rear end of the connector housing (55) for prevention of removal of the terminals from the connector housing.

Further, the connector terminal conduction test jig further comprises an elastic member (67) attached to said connector support member (39) to allow the engaging member (65) to be engaged correctly with the connector housing.

Further, each end of a plurality of the test pin accommodating holes (87) formed in the fitted contact projection (85) is formed into a conical shape to allow the terminal end (35a) of the terminal (35) to be inserted thereinto smoothly. Further, each of the terminal conduction test pins (89) movably disposed in the test body member (69) is elastically urged toward said connector support member (39) by a compression spring (81).

Further, the present invention provides a method of testing conduction of terminals (35) of a connector (49) having a rear terminal holder (65) engaged with a connector housing (55) thereof by a terminal conduction test jig (33), which comprises the steps of: fitting the connector (49) to be tested to a connector support member (39) of the terminal conduction test jig (33); and moving a test body (41) of the terminal conduction test jig toward the connector support member (39) to first engage the rear terminal holder (65) with the connector housing (55) normally and then inspect conduction of the terminals (35) of the connector (49).

Further, the step of moving the test body (41) comprises the steps of: inserting a fitted contact projection (85) of the test body (41) into the connector housing (55) so that a contact surface (83) of the test body (41) urges the connector housing (55) toward the connector support member (39) to engage the rear terminal holder with the connector housing normally; and moving the test body (41) further toward the connector support member (39) to bring terminal conduction test pins (89) movably arranged in the test body (41) into contact with terminal ends (35a) of the terminals (35) arranged in the connector housing (55) for terminal conduction test.

In the connector terminal conduction test jig according to the present invention, even if the rear terminal holder is not correctly fitted to the rear end portion of the connector, it is possible to effect the terminal conduction test without damaging the rear terminal holder. Further, when the test body is moved toward the connector support member, since the rear terminal holder can be fitted to the connector housing under the normal conditions, it is possible to effect the stable terminal conduction test of the connector, while correcting the engagement condition of the rear terminal holder with the connector housing of the connector to be tested.

DETAILED DESCRIPTION OF THE EMBODIMENTS

With reference to the attached drawings, an embodiment of the connector terminal conduction test jig according to the present invention will be described hereinbelow. In the following description, the front side is determined on the left side and rear side is determined on the right side in FIGS. 1A and B.

Figure 2A:
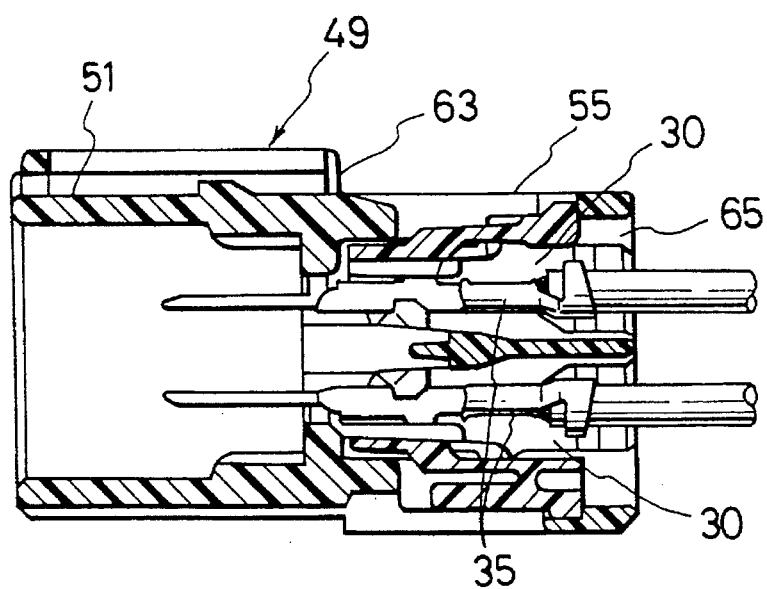
FIG. 2A is a cross-sectional view showing a connector to be inspected by the test jig according to the present invention, in which a rear terminal holder is attached to the connector housing correctly.
Figure 2B:
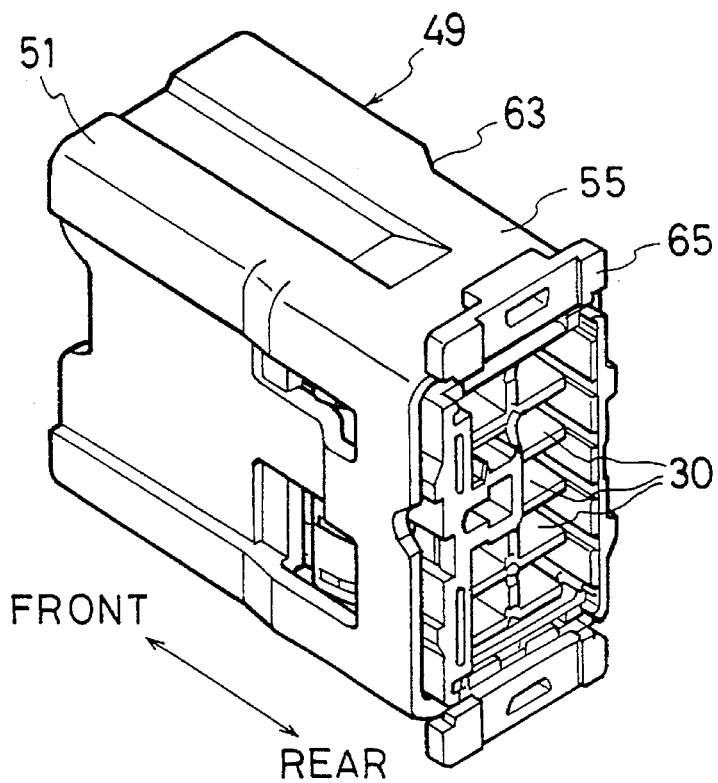
FIG. 2B is a perspective view showing the same connector shown in FIG. 2A, in which the rear holder is not correctly attached to the connector housing.
Figure 2C:
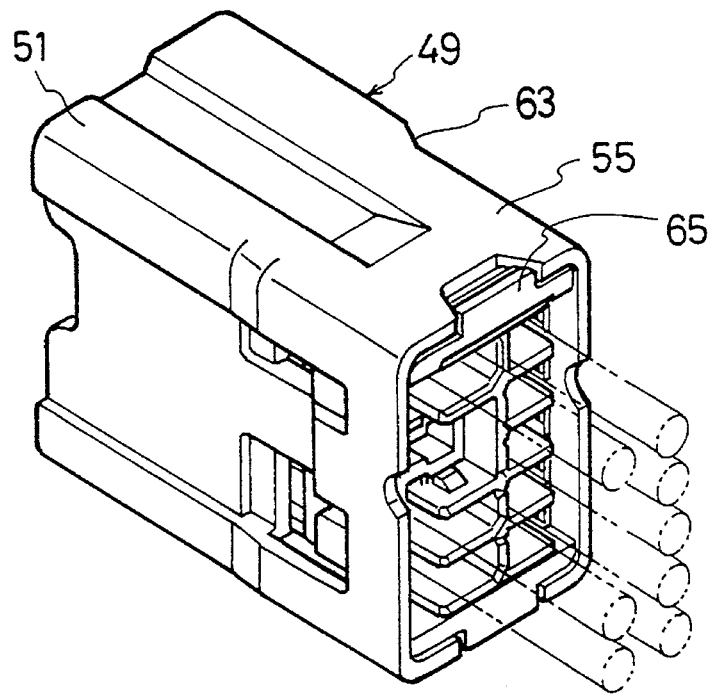
FIG. 2C is a perspective view showing the same connector shown in FIG. 2A, in which the rear holder is correctly attached to the connector housing.

Prior to the description of the test jig, the connector to be tested by the test jig according to the present invention will be explained with reference to FIGS. 2A to 2C. A female connector 49 is composed of a female connector housing 55 formed with a terminal accommodating chamber 30 for accommodating a number of terminals 35, and an engage hood portion 51 into which the ends of the terminals 35 project as shown in FIG. 2C. Further, a stepped portion 63 is formed between the connector housing 55 and the engage hood portion 51. Further, some rear terminal holders (engaging members) 65 are attached to the rear end (from which wires are taken out) of the connector housing 55 to hold the terminals 35 accommodated in the terminal accommodating chamber 30 from being removed therefrom. In the female connector 49 as described above, the respective conduction and the respective arrangement conditions of the terminals 35 in the connector housing 55 of the connector 49 are to be tested by the connector terminal conduction test jig 33 according to the present invention 33.

Figure 1A:
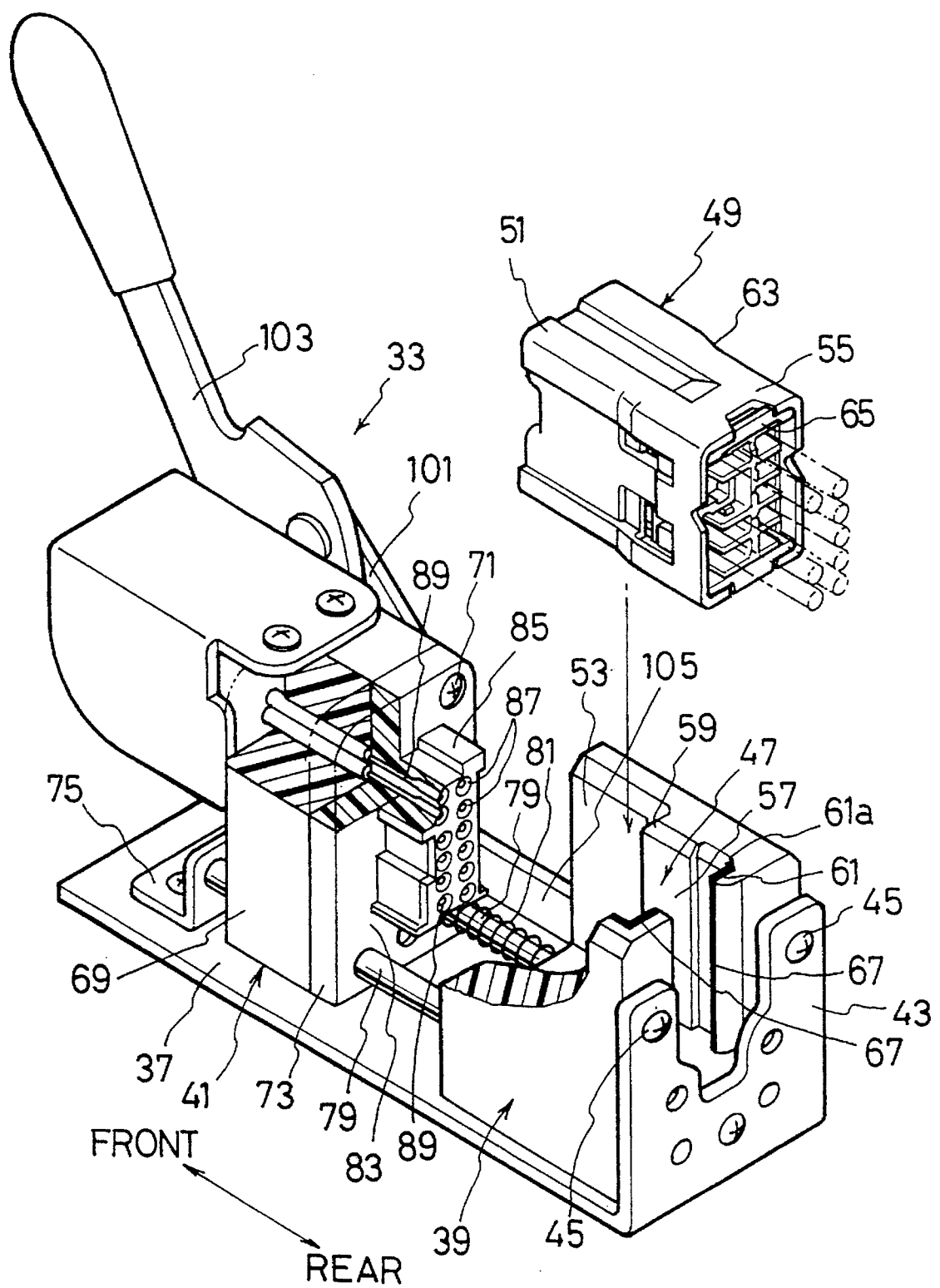
FIG. 1A is a perspective view showing an embodiment of the connector terminal conduction test jig according to the present invention.
Figure 1B:
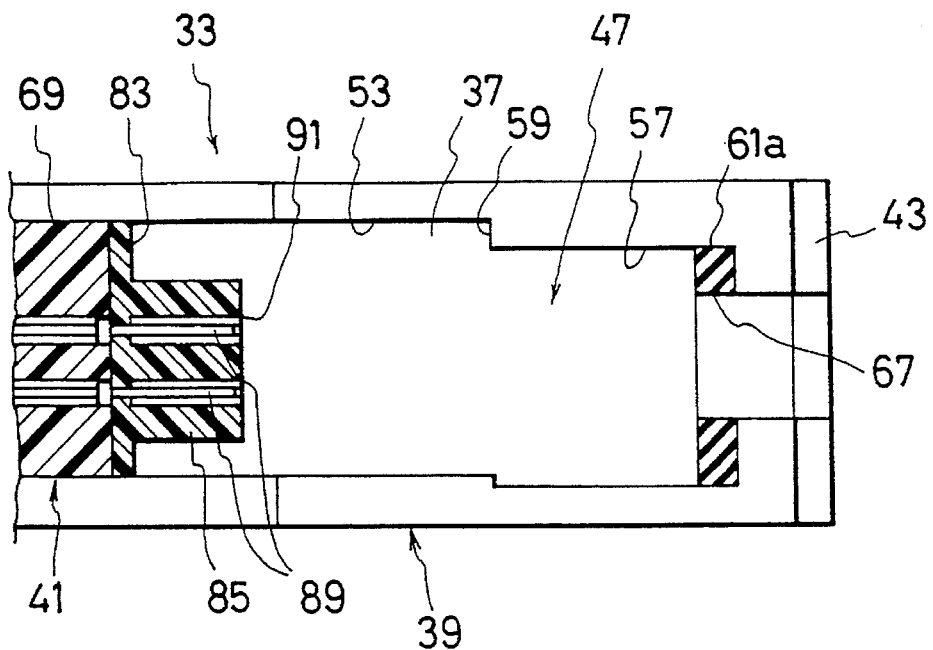
Fig. 1B is a plane view showing the same connector terminal conduction test jig shown in FIG. 1A.

As shown in FIGS. 1A and B, the connector terminal conduction test jig 33 is roughly composed of an L-shaped base plate 37, a connector support member 39 provided on the rear side of the base plate 37, and a test body 41 provided on the front side of the base plate 37 in such a way as to be moved toward or away from the connector support member 39. The connector support member 39 is fixed to a vertical portion 43 of the base plate 37 with screws 45. At the central portion of the connector support member 39, a connector fitting groove 47 is formed extending in the longitudinal direction of the base plate 37.

The connector fitting groove 47 is formed with a hood insertion portion 53 (into which the engage hood portion 51 of the female connector 49 is inserted) and a housing insertion portion 57 (into which the connector housing 55 thereof is inserted) continuously from the test body 41 side to the vertical portion 43 of the base plate 37. Further, a stepped portion 59 (with which the stepped portion 63 formed between the engage hood portion 51 and the housing 55 is inserted) is formed between the hood insertion portion 53 and the housing insertion portion 57. Further, a rear holder contact portion 61 (with which the rear end portion of the rear terminal holder 65 is brought into contact) is formed at the rear end portion of the housing insertion portion 57. Further, an elastic member (e.g., rubber) 67 is attached on the inner surface 61a of the rear holder end contact portion 61.

On the other hand, the test body 41 is composed of a test body member 69 and a contact plate member 73 fixed to the test body member 69 with screws 71. The test body 41 is slidably supported by two guide shafts 79 extending between an L-shaped support plate 75 fixed to the front side of the base plate 37 and the vertical portion 43 of the base plate 37. The two guide shafts 79 are passed through the connector support member 39 and fixed to the vertical portion 43. Further, a coil spring 81 is interposed between the connector support member 39 and the contact plate member 73 to urge the test body 41 away from the connector support member 39.

The contact plate member 73 is formed with a contact surface 83 brought into contact with the front end portion of the connector housing 55 of the female connector 49. Further, a fitted contact projection 85 is formed at the central portion of the contact plate member 73. The outer shape and size of the fitted contact projection 85 are determined so as to be fitted into the engage hood portion 51 of the female connector 49 supported by the connector support member 39.

Figure 3A:
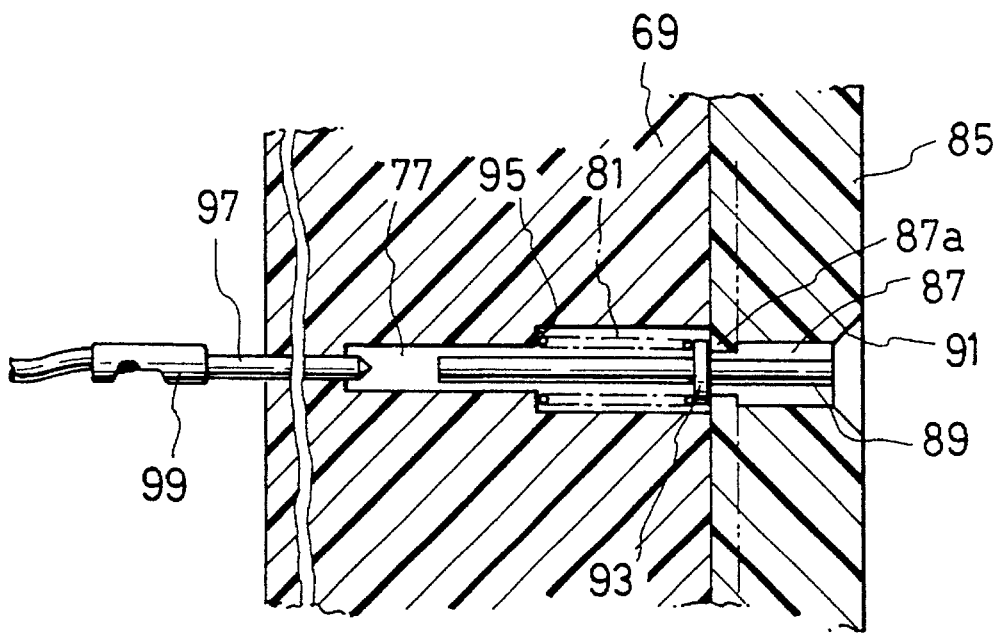
FIG. 3A is an enlarged cross-sectional view showing a test body member of the test jig according to the present invention, in which a terminal conduction test pin is not in contact with a connector terminal.

In the fitted contact projection 85, a plurality of test pin accommodating holes 87 are formed so as to communicate with a through hole 77 formed in the test body member 69, as shown in FIGS. 3A and B. Each test pin accommodating hole 87 is formed into conical shape 91 opened at the end surface thereof on the connector support member 39 side.

In each of the test pin accommodating hole 87 and the through hole 77, a terminal conduction test pin 89 having a stopper 93 at an intermediate portion thereof is disposed. Further, a compression spring 81 is disposed within the through hole 77 in such a way that the rear end thereof is in contact with a stopper 93 of the terminal conduction test pin 89 and the front end thereof is in contact with a shoulder portion 95 formed in an inner wall of the through hole 77, so that the stopper 93 is brought into contact with an inner aperture end portion 87a of the test pin accommodating hole 87 of the fitted contact projection 85. Further, a frontward inspection pin 97 is inserted into the through hole 77 with a space between the rear end thereof and the front end of the terminal conduction test pin 89. The frontward inspection pin 97 is inserted from the front side of the test body member 69 into the through hole 77 of the test body member 69. The front end of the frontward inspection pin 97 is connected to another terminal 99 which is connected to an output terminal of a conduction test apparatus (not shown).

Figure 3B:
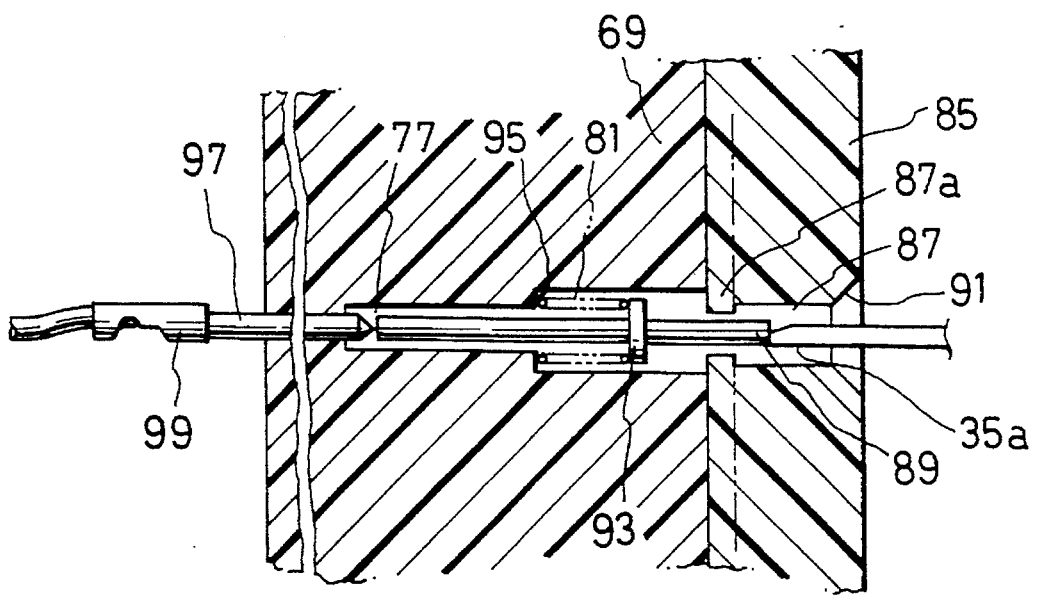
FIG. 3B is an enlarged cross-sectional view showing the test body member of the test jig according to the present invention, in which a conduction test pin is in contact with a connector terminal.

The terminal conduction test pin 89 is always urged toward the connector support member 39 by an elastic force of the compression spring 81. However, when the rear end of the terminal conduction test pin 89 is brought into contact with the terminal end 35a of the terminal 35 of the female connector 49, since the terminal conduction test pin 89 is urged deep in the frontward in the test pin accommodating hole 87 and the through hole 77, the terminal conduction test pins 89 is brought into contact with the rear end of the frontward inspection pin 97, as shown in FIG. 3B.

Further, an end of a link 101 is pivotally supported on one side of the test body 41. The other end of this link 101 is pivotally connected to an operation lever 103 in FIG. 1A. The operation lever 103 is pivotally connected to a side wall 105 (bent at an end of the base plate 37). Therefore, when the operation lever 103 is pivoted, the test body 41 can be moved toward or away from the connector support member 39 via the link 101.

Figure 4A:
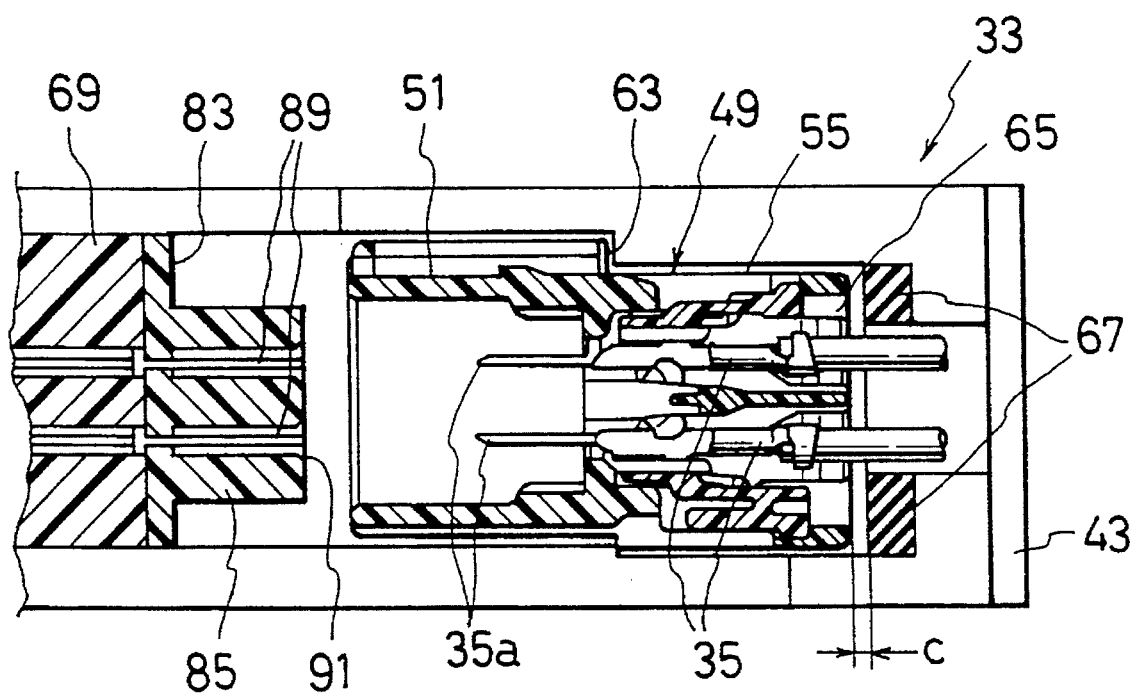
FIG. 4A is a cross-sectional view showing the connector to be tested, which is fitted to the test jig according to the present invention.

In use of the connector terminal conduction test jig 33 according to the present invention to test the conduction of the terminals 35 of the female connector 49, first as shown in FIG. 4A, the female connector 49 to be tested is fitted to the connector fitting groove 47 of the connector support member 39. Under these conditions, there exists a clearance between the rear end of the female connector 49 and the elastic member 67 of the connector support member 39.

Figure 4B:
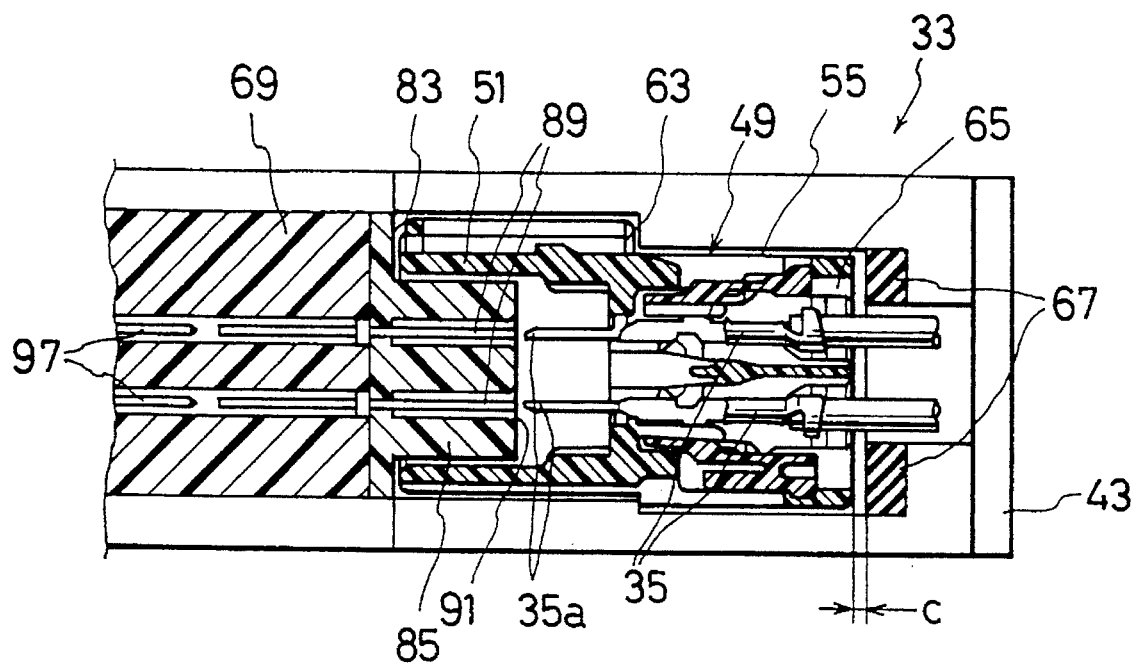
FIG. 4B is a cross-sectional view showing the connector to be tested, which is fitted to the test jig according to the present invention and further the test body member is shifted toward the connector to be tested.

Then, as shown in FIG. 4B, when the operation lever 103 is pivoted to move the test body 41 toward the connector support member 39, since the fitted contact projection 85 is fitted into the engage hood portion 51 of the female connector 49, the connector terminals 35 projecting into the engage hood portion 51 of the female connector 49 are Inserted into the test pin accommodating holes 87 (See FIG. 3B) of the fitted contact projection 85 and further brought into contact with the front end surfaces of the terminal conduction test pins 89 against an elastic force of the compression springs 81. Under these conditions, since being moved in the frontward direction, the terminal conduction test pins 89 are brought into contact with the rear ends of the frontward inspection pins 97 as shown in FIG. 3B.

In this case, in case the terminals 35 within the engage hood portion 51 of the female connector 49 are inclined from the normal directions, since the front ends 35a of the terminals 35 are brought into contact with and further guided along the conical surfaces 91 (See FIG. 3A) of the test pin accommodating holes 87, the inclined terminals 35 are correctly guided into the test pin accommodating holes 87 toward the terminal conduction test pins 89.

Figure 5A:
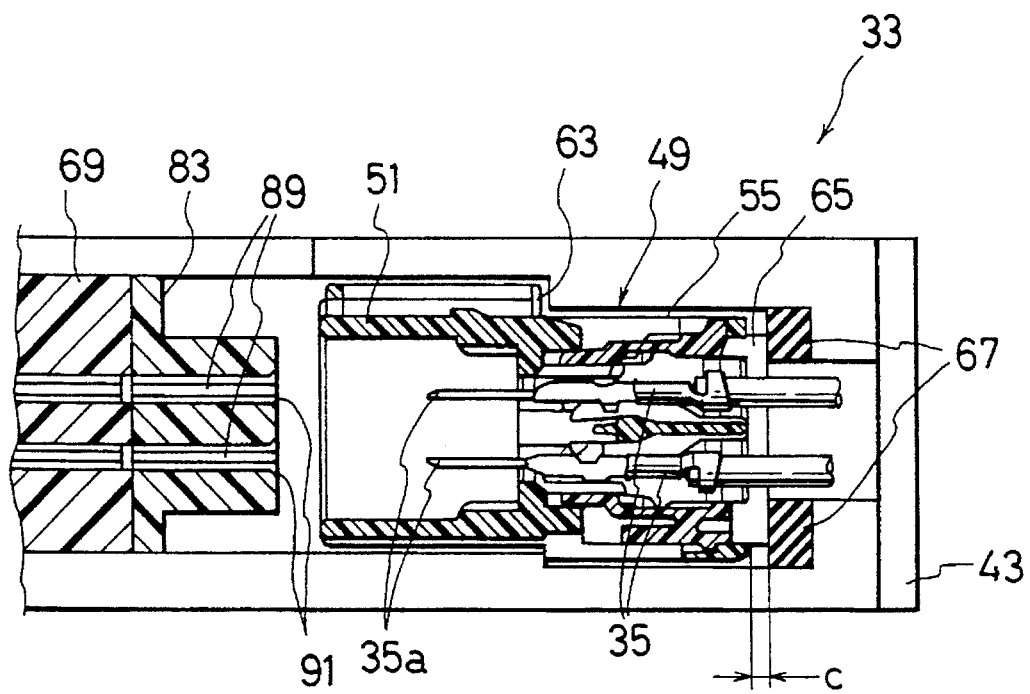
FIG. 5A is a cross-sectional view showing the connector to be tested (to which a rear terminal holder is not correctly attached), which is fitted to the test jig according to the present invention.
Figure 5B:
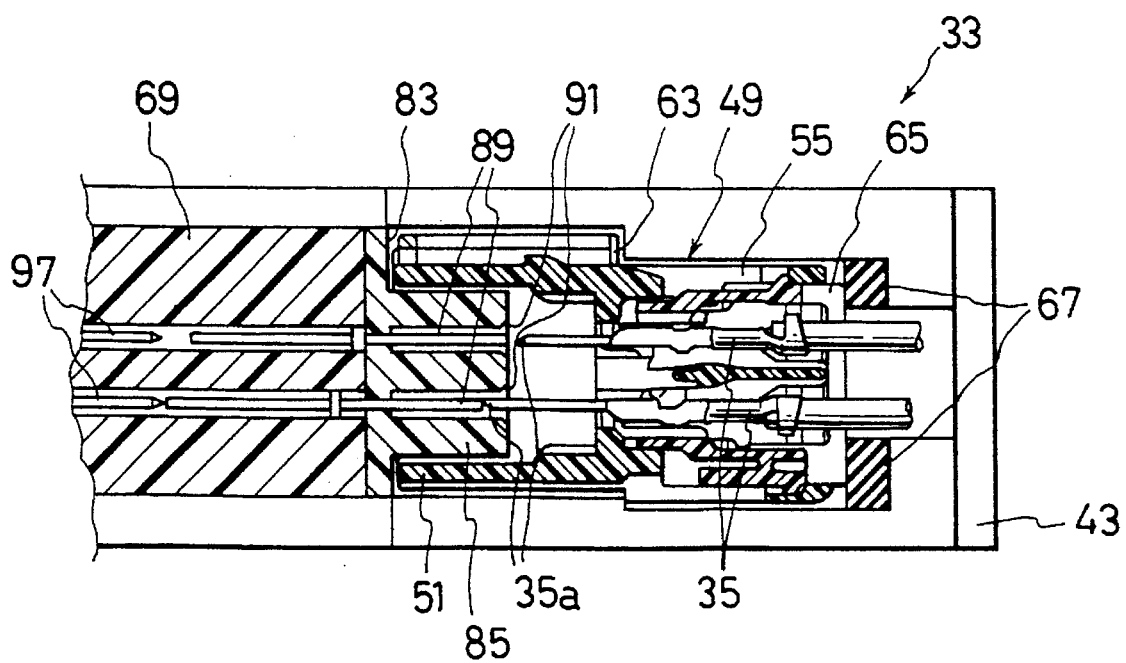
FIG. 5B is a cross-sectional view showing the connector to be tested (to which the rear terminal holder is not correctly attached), which is fitted to the test jig according to the present invention and further the test body member is shifted toward the connector.

In additions, when the terminals 35 are not perfectly inserted within the terminal accommodating chamber 30 of the female connector 49, since the rear terminal holder 65 cannot be attached normally to the rear end portion of the female connector 49, the rear terminal holder 65 projects from the rear end of the female connector housing 55 within the clearance C as shown in FIG. 5A. Under these conditions, however, when the operation lever 103 is pivoted to move the test body 41 toward the connector support member 39 side, since the fitted contact projection 85 is inserted into the engage hood portion 51 of the female connector 49, the terminal conduction test pin 89 is brought into contact with the front end 35a of only the terminal 35 (the lower side in FIG. 5B) inserted into the connector housing 55 correctly. In this case, however, when the fitted contact projection 85 is further inserted into the engage hood portion 51 of the female connector 49, since the contact surface 83 of the contact plate member 73 is brought into contact with the front end edge of the engage hood portion 51 of the female connector 49, the female connector 49 is further moved toward the connector support member 39. Accordingly, the rear terminal holder 65 is brought into contact with the elastic member 61a of the rear end contact portion 61, and further pushed into the connector housing 55 of the female connector 49 perfectly, so that the rear terminal holder 65 can be engaged with the connector housing 55 normally.

Figure 4C:
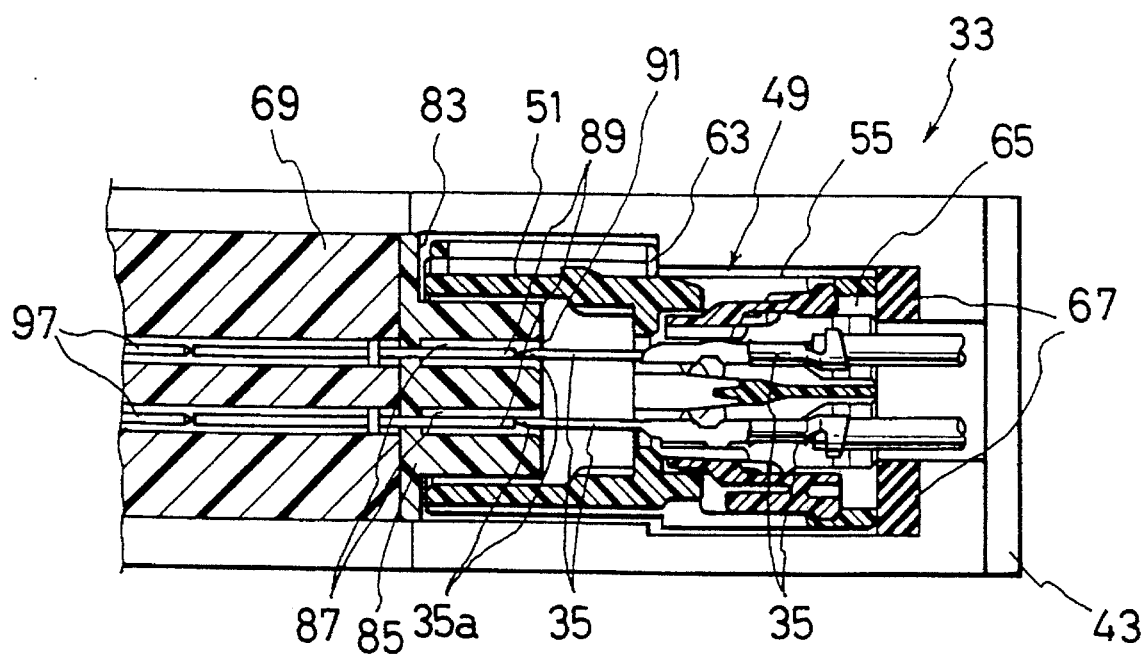
FIG. 4C is a cross-sectional view showing the connector to be tested, which is fitted to the test jig according to the present invention and further the test body member is shifted toward the connector so that the conduction test pins can be brought into contact with the connector terminals.

As a result, it is possible to insert the terminal 35 (the upper side in FIG. 5B) into the test pin accommodating hole 87 of the fitted contact projection 85 normally so that the terminal end 35a of the terminal 35 can be brought into contact with the terminal conduction test pin 89 correctly, as shown in FIG. 4C.

After the conduction test of the terminals 35 has been completed, the operation lever 103 is pivoted counterclockwise in FIG. 1A to move the test body 41 away from the connector support member 39. Then, since the test body 41 is shifted in the frontward direction away from the connector housing 49; that is, the fitted contact projection 85 is removed from the engage hood portion 51 of the female connector 49, as shown in FIG. 5A, the terminal conduction pins 89 are separated away from the front ends 35a of the terminals 35.

As described above, in the connector terminal conduction test jig according to the present invention, even if the rear terminal holder 65 is not correctly fitted to the rear end portion of the female connector 49, it is possible to effect the terminal conduction test without damaging the rear terminal holder 65. Further, when the test body 41 is moved toward the connector support member 39, since the rear terminal holder 65 can be fitted to the connector housing 55 under the normal conditions, it is possible to effect the stable terminal conduction test of the female connector 49, while correcting the engagement condition of the rear terminal holder 65 with the connector housing 55.

Further, since the elastic member 67 is provided at the connector support member 39, when the female connector 49 is urged against the connector support member 39, it is possible to push the rear terminal holder 65 uniformly into the connector housing 55 and thereby to engage the rear terminal holder 65 with the female connector 49 under the normal conditions. Further, even if the length of the female connector 49 disperses, since the elastic member 67 can absorb the difference in dimension of the connector length, it is possible to firmly fix the female connector 49 against the connector support member 39.

Further, in the above-mentioned embodiment, although the female connector 49 has been explained, it is of course possible to adopt the connector terminal conduction test jig according to the present invention to a male connector.

As described above, in the connector terminal conduction test jig according to the present invention, after some terminal conduction test pins 89 have been brought into contact with some terminals 35, since the contact surface 83 of the test body 41 pushes the connector 49 toward the connector support member 39 together with the rear terminal holder 65, it is possible to push the rear terminal holder 65 into the connector housing 55 correctly without damaging the rear terminal holder 65 during the terminal pin conduction test.

Further, since the elastic member is provided at the front end surface of the connector support member 39, it is possible to push the rear holder not correctly engaged with the connector 49 uniformly, so that the rear holder can be engaged with the connector correctly.

What is claimed is:

1. A connector terminal conduction test jig for testing conduction of terminals (35) of a connector (49) having a engaging member (65) engaged with a connector housing (55) thereof, which comprises:

a connector support member (39) for supporting the connector (49) to be tested;

a test body member (69) disposed movably toward and away from said connector support member and formed with a plurality of through holes (77) each for supporting a terminal conduction test pin (89) movably therein;

a contact plate member (73) attached to said test body member and composed of a contact surface (83) and a fitted contact projection (85) formed with a plurality of test pin accommodating holes (87) each communicating with each through hole (77) of said test body member; and when said test body member (69) is moved toward said connector support member (39), the fitted contact projection (85) being first inserted into the connector housing (55) so that the contact surface (83) of said contact plate member (73) urges the connector housing (55) toward said connector support member (39) to correctly engage the engaging member (65) with the connector housing (55), and after that terminal ends (35*a*) of the terminals (35) arranged in the connector housing being inserted into the test pin accommodating holes (87) of the fitted contact projection (85) into contact with the terminal conduction test pins (89) in the test body member (69) for terminal conduction test.

2. The connector terminal conduction test jig of claim 1, wherein the engaging member (65) engaged with the connector housing is a rear terminal holder attached to a rear end of the connector housing (55) for prevention of removal of the terminals from the connector housing.

3. The connector terminal conduction test jig of claim 1, which further comprises an elastic member (67) attached to said connector support member (39) to allow the engaging member (65) to be engaged correctly with the connector housing.

4. The connector terminal conduction test jig of claim 1, wherein each end of a plurality of the test pin accommodating holes (87) formed in the fitted contact projection (85) is formed into a conical shape to allow the terminal end (35*a*) of the terminal (35) to be inserted thereinto smoothly.

5. The connector terminal conduction test jig of claim 1, wherein each of the terminal conduction test pins (89) movably disposed in the test body member (69) is elastically urged toward said connector support member (39) by a compression spring (81).

6. A method of testing conduction of terminals (35) of a connector (49) having a rear terminal holder (65) engaged with a connector housing (55) thereof by a terminal conduction test jig (33), which comprises the steps of:

fitting the connector (49) to be tested to a connector support member (39) of the terminal conduction test jig (33); and moving a test body (41) of the terminal conduction test jig toward the connector support member (39) to first engage the rear terminal holder (65) with the connector housing (55) normally and then inspect conduction of the terminals (35) of the connector (49).

7. The method of testing conduction of terminals (35) of claim 6, wherein the step of moving the test body (41) comprises the steps of:

inserting a fitted contact projection (85) of the test body (41) into the connector housing (55) so that a contact surface (83) of the test body (41) urges the connector housing (55) toward the connector support member (39) to engage the rear terminal holder with the connector housing normally; and moving the test body (41) further toward the connector support member (39) to bring terminal conduction test pins (89) movably arranged in the test body (41) into contact with terminal ends (35a) of the terminals (35) arranged in the connector housing (55) for terminal conduction test.

* * * * *